US008766833B1

(12) United States Patent
Bogner

(10) Patent No.: US 8,766,833 B1
(45) Date of Patent: Jul. 1, 2014

(54) SYSTEM AND METHOD FOR CALIBRATING A CIRCUIT

(71) Applicant: Infineon Technologies Austria AG, Villach (AT)

(72) Inventor: Peter Bogner, Wernberg (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/787,165

(22) Filed: Mar. 6, 2013

(51) Int. Cl.
*H03M 1/10* (2006.01)
(52) U.S. Cl.
CPC .................................. *H03M 1/1009* (2013.01)
USPC ............................ 341/120; 341/155; 341/118
(58) Field of Classification Search
CPC ....... H03M 1/1009; H03M 1/56; H03M 1/06; H03M 1/0604; H03M 1/0609
USPC ........................... 341/118, 172, 120, 155, 144
See application file for complete search history.

(56) References Cited

U.S. PATENT DOCUMENTS

| | | | | |
|---|---|---|---|---|
| 5,774,733 A * | 6/1998 | Nolan et al. | | 713/300 |
| 5,852,415 A | 12/1998 | Cotter et al. | | |
| 6,107,637 A * | 8/2000 | Watanabe et al. | | 250/559.3 |
| 7,589,650 B2 * | 9/2009 | Hsien et al. | | 341/118 |
| 8,416,106 B2 * | 4/2013 | Thachile | | 341/120 |
| 2011/0032128 A1 * | 2/2011 | Watanabe et al. | | 341/120 |
| 2011/0254569 A1 | 10/2011 | Bogner et al. | | |
| 2014/0002286 A1 | 1/2014 | Bogner et al. | | |

OTHER PUBLICATIONS

Hansen et al., "Wideband micromachined capacitive microphones with radio frequency detection," J. Acoust. Soc. Am. 116 (2), Aug. 2004, pp. 828-842.

* cited by examiner

*Primary Examiner* — Peguy Jean Pierre
(74) *Attorney, Agent, or Firm* — Slater & Matsil, L.L.P.

(57) ABSTRACT

In accordance with an embodiment, a method of calibrating a circuit includes coupling a first reference voltage to a first input of the circuit, coupling a programmable reference voltage to a reference node of a digital-to-analog converter (DAC), such that the gain of the DAC is dependent on an input value at the reference node. The method further includes providing a first predetermined input code to the DAC, summing an output of the DAC with the first reference voltage to produce a summed output, comparing the summed output to a threshold, and adjusting the programmable reference voltage until the summed output is within a predetermined range of the threshold.

34 Claims, 4 Drawing Sheets

SYSTEM AND METHOD FOR CALIBRATING A CIRCUIT

TECHNICAL FIELD

This invention relates generally to semiconductor circuits and methods, and more particularly to a system and method for calibrating a circuit.

BACKGROUND

In recent years, it has become more common for automotive electronic systems, such as engine control systems, antilock brake system (ABS), and airbag safety systems, to be designed to use one or more central controller systems that are coupled to multiple electronic sensors distributed throughout the automobile. For example, an automotive air bag system may have a central airbag controller coupled to a number of acceleration sensors distributed in various places in the automobile and one or more airbags that are configured to be deployed via explosive squibs. During operation, the network of acceleration sensors sends sensor information in the form of analog voltages to the central controller, which performs an analog-to-digital conversion on each of the analog voltages, and determines whether or not to deploy the airbag based on the converted analog values from the sensors. Similarly, an antilock brake system or an engine control systems will monitor analog voltages emanating from various sensors and systems that measure speed, pressure, acceleration, temperature, and the like.

One way in which the plethora of analog signals is handled is by using one or more analog-to-digital converters (ADCs) resident in the respective controller. For example, a microcontroller integrated circuit having one or more analog-to-digital converters resident on the chip may be used. In systems with multiple analog inputs, a multiplexer may be used to handle multiple analog input signals. By time division multiplexing the various analog signals at the input, one analog-to-digital converter may be used to perform a conversion on multiple analog input lines.

SUMMARY OF THE INVENTION

In accordance with an embodiment, a method of calibrating a circuit includes coupling a first reference voltage to a first input of the circuit, coupling a programmable reference voltage to a reference node of a digital-to-analog converter (DAC), such that the gain of the DAC is dependent on an input value at the reference node. The method further includes providing a first predetermined input code to the DAC, summing an output of the DAC with the first reference voltage to produce a summed output, comparing the summed output to a threshold, and adjusting the programmable reference voltage until the summed output is within a predetermined range of the threshold.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a successive approximation analog-to-digital converter. The invention may also be applied, however, to other types of circuits, systems, and methods directed toward data and signal acquisition and/or calibration. For example, embodiments systems may be directed toward data converters having other architectures besides successive approximation ADCs. Embodiment systems may be further directed toward a variety of automotive and non-automotive applications.

Figure 1A:
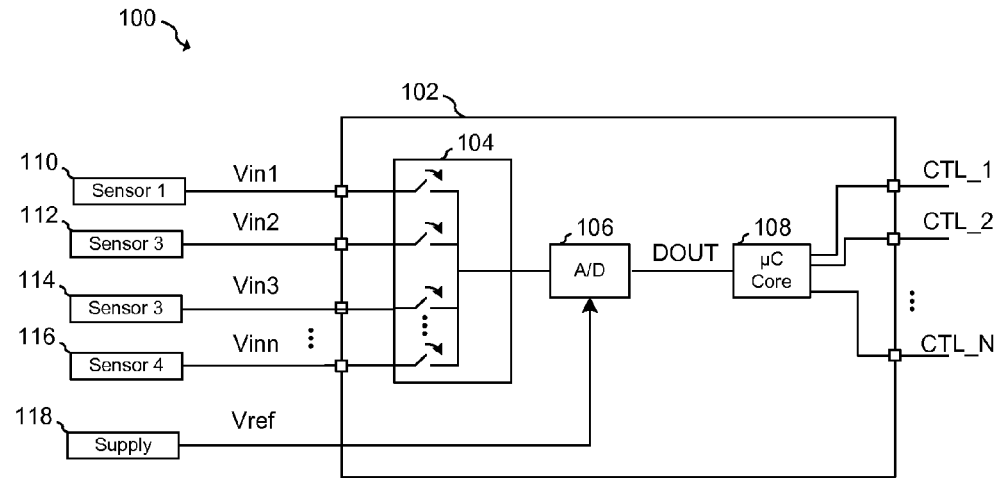
FIGS. 1a-b illustrate conventional data acquisition circuits.

FIG. 1a illustrates a data acquisition system 100 according to a conventional implementation that includes controller 102 coupled to sensors 110, 112, 114 and 116. Controller 102 includes an input multiplexer 104, the output of which is coupled to A/D converter 106. During operation of controller 102, one input of multiplexer 104 is routed to the input of analog-to-digital converter 106, and an A/D conversion is performed. In some implementations, the assigned input to multiplexer 104 may change over time. For example each input of multiplexer 104 may be cyclically routed to A/D converter 106 according to a repeated pattern so that the conversion of the outputs of sensors 110, 112, 114 and 116 are time multiplexed. Microcontroller core 108 processes the digital outputs of A/D converter 106 and provides control signals CTL_1 to CTL_N that may be used to provide control signals to various functions within a system. For example, in an automotive system, CTL_1 to CTL_N may be used to control functions related to engine, fuel system, and safety system operation.

In some systems, the output voltages of one or more sensors 110, 112, 114 and 116 are referenced with respect to a reference voltage or a power supply voltage. For example, a pressure sensor may be configured to produce a known full-scale value that corresponds to a power supply and/or reference voltage coupled to the pressure sensor. In such cases, the sensor supply voltage may be further coupled to A/D converter 106 in order to provide a digital output code that is ratiometrically dependent on the supply voltage or a reference voltage of the sensor. For example, supply block 118 may output voltage Vref that is coupled to a reference input node of A/D converter 106.

Figure 1B:
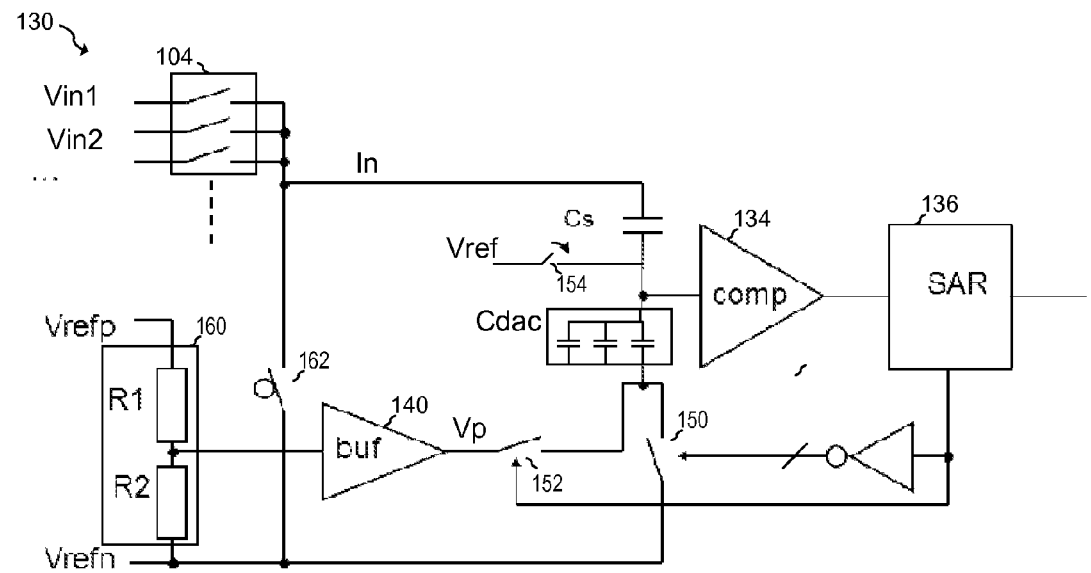

FIG. 1b illustrates conventional A/D converter 130 having a successive approximation architecture. During operation, an input voltage is sampled on capacitor Cs, the top plate of which is coupled to the input of comparator 134. During sampling, selected ones of input voltages Vin1 or Vin2 are coupled to the bottom plate of sampling capacitor Cs, while the top plates of sampling capacitor Cs is coupled to voltage Vref via switch 154, and the bottom plates of capacitor array Cdac are all coupled to negative reference voltage Vrefn or positive reference voltage Vp. Next, switch 154 is opened, and the bottom plate of capacitor Cs is coupled to negative reference node Vrefn via switch 162, and the bottom plates of capacitor array Cdac are coupled such that half of the capacitance is coupled to positive reference voltage Vp, and the other half of the capacitance is coupled to negative reference voltage Vrefn via switches 150 and 152. It should be understood that while switches 150 and 152 are shown each as an individual switch, each switch 150 and 152 represent multiple switches that are each coupled to a corresponding capacitance in DAC capacitor array Cdac.

As a result of reconfiguring the coupling of the top and bottom plates of capacitor Cs and capacitor array Cdac, the input node of comparator 134 is pushed above or below a threshold. Based on the output of comparator 134, the switch configuration of switches 150 and 152 are modified in a manner to bring the input voltage of comparator 134 closer to its threshold. This may be accomplished by using successive approximation register (SAR) 136 to determine a next state of switches 150 and 152 over multiple cycles to perform a binary search for a switch configuration that minimizes the difference between the input voltage of comparator 134 and its threshold. Generally, each comparison cycle yields a single bit of resolution. Therefore, an 8-bit conversion may be performed in 8 cycles, a 10-bit conversion may be performed in 10 cycles, and a 12-bit conversion may be performed in 12 cycles. By the time all cycles are complete, the output of word of the successive approximation is fully formed in successive approximation register 136. The operation of such a successive approximation A/D converter is described, for example, in U.S. patent application Ser. No. 12/761,017 entitled "Measurement Apparatus," and in U.S. patent application Ser. No. 13/539,658, both of which applications are incorporated by reference in their entirety.

Positive reference voltage Vp is generated by performing a voltage division of the potential difference between voltages Vrefp and Vrefn using voltage divider 160, the output of which is buffered using voltage buffer 140. Voltage divider 160 may be implemented using, for example, a resistor divider circuit or a switched capacitor voltage division circuit. By using voltage divider 160, buffer 140, comparator 134 and successive approximation register 136 may be powered using a low voltage power supply and using low voltage devices, while input voltages Vin1 and Vin2 have a voltage range that exceeds the power supply voltage used by buffer 140, comparator 134 and successive approximation register 136. For example, voltage reference Vrefp may be set to 5V, which corresponds to a full scale value of Vin1 or Vin2 of 5V. If voltage divider is set to have a voltage division ratio of 5:1, the output of voltage divider 160 is about 1V. In this case, a full-scale digital output of the successive approximation A/D will correspond to an input voltage of 5V at Vin1 or Vin2.

Figure 2A:
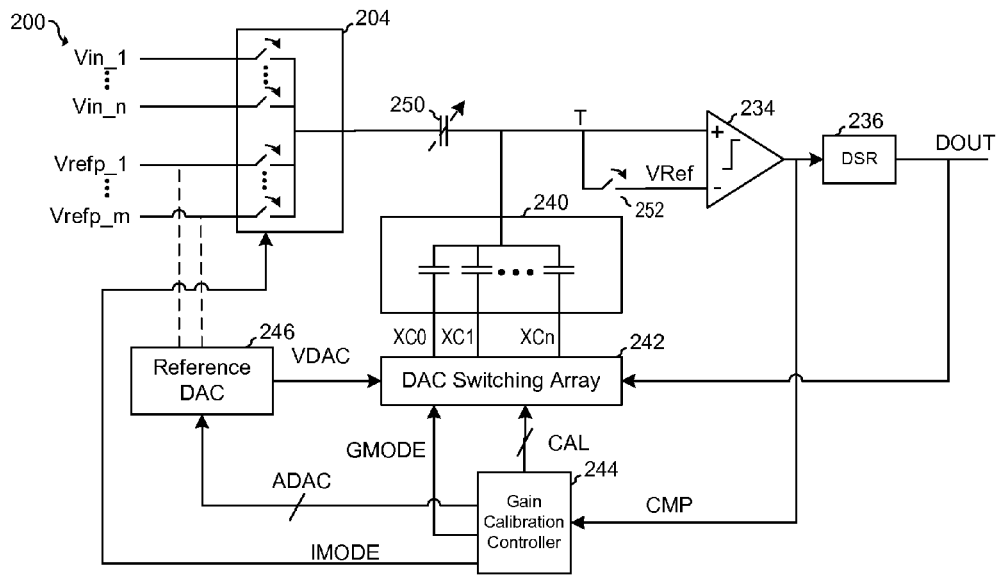
FIGS. 2a-e illustrate a data acquisition circuit according to embodiments of the present invention.

FIG. 2a illustrates data converter 200 according to an embodiment of the present invention. Data converter 200 has input switching array 204 that multiplexes voltage inputs Vin_1 to Vin_n, and voltage reference inputs Vrefp_1 to Vrefp_m, where n represents the number of multiplexed input channels and m represents the number of reference voltages. The numbers n and m may or may not be equal to each other, although n is typically greater than m. The input switching array 204 also has Vrefn as an input, which is a local reference voltage input that may be a ground reference in some embodiments. The output of input switching array 204 is coupled to sampling capacitor 250. In one embodiment, the output of input switching array 204 is coupled to a bottom plate of capacitor 250, while the top plate of capacitor 250 is coupled to the input of comparator 234 node T and to the top plates of the capacitors within capacitor array 240. Alternatively, the top and bottom plates of input sampling capacitor 250 and capacitor array 240 may be arranged differently. By coupling the top plates of capacitor 250 and capacitor array 240 to the input of comparator 234, in accuracies due to parasitic charge sharing is minimized. Since the bottom plates of capacitor 250 and capacitor array 240 are driven by relatively low impedance sources, parasitic capacitances coupled to the bottom plates of capacitor 250 and capacitor array does not pose a problem with respect to charge sharing and redistribution between these capacitances. In some embodiments, capacitor 250 may be implemented using a plurality of switchable capacitors. In such embodiments, the gain of data converter 200 may be further adjusted by selecting the capacitance of capacitor 250 via the switchable capacitors.

In one embodiment, capacitor array 240 has 12 capacitors that each represent one bit of resolution. In such an embodiment, data converter 200 is configured as a 12-bit A/D. Alternatively, other greater or fewer capacitors may be used to achieve different bit resolutions. For example, capacitor array 240 may have 8 capacitors to achieve 8-bits of resolutions. In some embodiments, some or all of the 12 capacitors may be implemented using multiple unit capacitors. In some embodiments, the capacitors within capacitor array 240 binary weighted such that capacitor array 240 is operated as a binary weighted capacitor array. In other embodiments, some or all of the capacitors within capacitor array 240 are thermometer coded. In addition, additional capacitors may be included within capacitor array 240 in order to calibrate the accuracy in linearity of the array. In one embodiment, the total capacitance of capacitor array 240 is between about 2 pF and about 3 pF. The capacitance of sampling capacitor 250 may be set to be at about one fourth the capacitance of capacitor array 240 in order to achieve, for example, a 1 to 5 voltage division ratio. For example, with the voltage division ratio of 1 to 5, a full-scale voltage of 5 V may be converted with a VDAC set to be about 1 V. It should be appreciated that in alternative embodiments of the present invention, different capacitance values and different voltage division ratios may be used with respect to input sampling capacitor 250 and capacitor array 240.

During operation, one of analog input voltages Vin_1 to Vin_n is selected by the input switching array 204, and is coupled to the bottom plate of input sampling capacitor 250. In one embodiment, top plate node T is coupled to reference voltage Vref via switch 252, switch 252 is opened, and the bottom plates of capacitor array 240 are coupled to either local reference voltage VDAC or negative reference voltage Vrefn via DAC switching array 242 in a first charge redistribution step. Comparator 234 then compares the voltage at node T with reference voltage Vref. In an alternative embodiments, comparator 234 and switch 252 may be implemented using an auto-zeroing comparator, in which case, voltage Vref corresponds to the auto-zeroed voltage of the comparator. In further alternative embodiments, comparator 234 may be a multi-bit comparators implemented, for example, using a plurality of comparators referenced to different reference voltages in a flash A/D configuration.

Based on the output of comparator 234, digital search register (DSR) 236 supplies produces a next switch configuration estimate, which is applied to the bottom plates of capacitor array 240 via DAC switching array 242. In some embodiments, DSR 236 may be implemented using a successive approximation register (SAR), which case, operation proceeds in a binary search manner as described in U.S. patent application Ser. Nos. 12/761,017 and 13/539,658. In other embodiments, DSR 236 may be implemented using a tracking register and/or may implement other search methods besides a digital successive approximation search. In some embodiments, DSR 236 may implement a non-binary search, for example, in embodiments in which capacitor array is a non-binary capacitor array.

In embodiments of the present invention, the reference voltage supplied to capacitor array 240 via DAC switching array 242 undergoes a process of calibration. By calibrating reference voltage VDAC, conversion gain inaccuracies caused, for example, by component mismatch may be minimized and/or eliminated. In some embodiments, the generation of reference voltage VDAC may be performed entirely within a low voltage power supply domain. As such, small compact devices optimized for small size and low voltage operation may be used to more efficiently generate reference voltage VDAC in terms of both lower power consumption and a smaller die area.

In an embodiment, gain calibration controller 244, and reference DAC 246 work together to calibrate the gain of the data converter 200. During a calibration step, one of reference voltages Vrefp__1 to Vrefp_n are selected via input switching array 204 and applied to the bottom plate of capacitor 250 during a sampling phase. Meanwhile, reference voltage Vref is applied to node T, and the bottom plates of DAC switching array 242 are coupled to Vrefn or ground. Next, during a comparison phase, switch 252 is opened, the bottom plate of capacitor 250 is coupled to Vrefn or ground, and the bottom plates of capacitor array 240 are coupled to a predefined value. In some embodiments, this predefined value correspond to a full-scale value, such that all of the bottom plates of capacitor array 240 are coupled to voltage VDAC, or all of the bottom plates of capacitor array are coupled to Vrefn. Alternatively, other codes may be used according to the particular application and its specifications. This pre-defined value is represented in FIG. 2a as being transmitted on digital bus CAL. In embodiment that use full-scale DAC switching array values during calibration, signal CAL may be omitted and the pre-defined value may be hard-coded within DAC switching array 242.

If reference voltage VDAC is calibrated such that VDAC corresponds to a full-scale input as defined by the selected reference voltage Vrefp__1 to Vrefp_n, the resulting voltage at node T in the comparison phase will be approximately threshold Vref. If reference voltage VDAC does not correspond to the selected reference voltage Vrefp__1 to Vrefp_n, a full scale input voltage, as defined by the selected reference voltage will produce an output voltage code at DOUT that is less than the full scale value or, the output voltage code at DOUT will produce a full scale value for voltage values that are less than then selected reference voltage, thereby signifying a gain error.

In an embodiment, gain calibration controller iteratively adjusts reference DAC 246 such that a selected reference voltage substantially corresponds to a full-scale data converter output at output bus DOUT. This iterative adjustment may be performed, for example, by performing a binary search, or a linear search. A binary search, for example, may be performed by initializing reference DAC 246 to a first value using a coarse resolution. Depending on the output of comparator 234, the next iteration may be performed by initializing reference DAC 246 to the closer value using a finer resolution than the first iteration. As the iterative adjustment continues, the step size of each iteration decreases until the resulting value at node T is within a predetermined range of reference voltage VREF. In a linear search, on the other hand, reference DAC 246 is initialized with an initial value that corresponds to a gain value that is either slightly too high or slightly too low. Gain calibration controller 244, then increments or decrements the value of reference DAC 246 input value ADAC until the output of comparator 234 changes polarity.

In some embodiments, reference DAC 246 derives output voltage VDAC based on one or more of reference voltages Vrefp__1 to Vrefp_n directly. In such embodiments, reference DAC 246 is coupled to one or more of reference voltages Vrefp__1 to Vrefp_n, as indicated by the dotted lines in FIG. 2A. Furthermore, in some embodiments the gain calibration controller 244 may issue mode control signals GMODE and IMODE. IMODE may be used to control the reference input of the data converter, and GMODE may be used to and place DAC switching array 242 in a calibration mode. It should be appreciated that these mode control signals may be generated by a dedicated controller in other embodiments. In addition, embodiments of the present invention may utilize other types of control signals and control signal schemes as known in the art that are not explicitly shown in FIG. 2A. For example, some circuits and methods as described in U.S. patent application Ser. Nos. 12/761,017 and 13/539,658 be incorporated in some embodiments.

In one embodiment, data converter 200 has a sampling rate of about 5 Ms/s using an internal clock rate of between about 100 MHz and about 200 Mhz. Alternatively, other sampling rates an internal clock rates may be used. In a further alternative embodiment, data converter 200 may be implemented using a differential architecture instead of the single-ended architecture as shown in FIG. 2a.

Figure 2B:
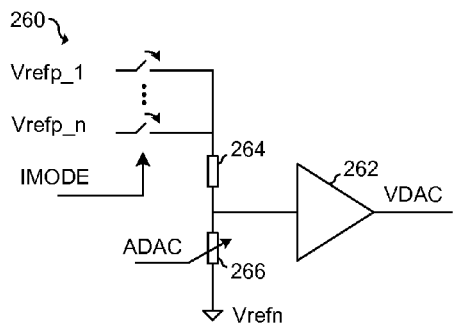

FIG. 2b illustrates reference DAC 260 according to an embodiment of the present invention, which may be used to implement reference DAC 246 shown in FIG. 2a. Reference DAC 260 has a programmable voltage divider implemented using resistor 264 and adjustable resistor 266. The output of the programmable voltage divider is buffered by voltage buffer 262 that provides a low impedance output at node VDAC. During operation, voltage value of node VDAC may be adjusted by adjusting the value of resistor 266, which may be implemented using a selectable resistor, whose resistances are switched in and out based on digital input ADAC. For example, in one embodiment, when the output of comparator 234 is in a first state, the resistance of selectable resistor 266 is decreased. On the other hand, when the output of comparator 234 is in a second state, the resistance of selectable resistor is increased. To illustrate this further consider the following calibration example:

Calibration step 1: CMP=0→decrease resistor 266;
Calibration step 2: CMP=0→decrease resistor 266;
Calibration step 3: CMP=1→increase resistor 266;
Calibration step 4: CMP=0→decrease resistor 266;
Calibration step 5: CMP=1→increase resistor 266; and
Calibration step 6: CMP=0→decrease resistor 266.

In some embodiments, the above illustrated increase and decrease of resistor 266 may occur in very small steps. In some cases, comparator 234 will generate a sequence of 0-1-0-1-... as node T toggles around threshold Vref when resistor 266 reaches its target value.

In alternative embodiments, resistor 266 may be implemented using other devices such as a MOSFET operated in its linear region. In this case, control signal ADAC may be an analog signal. A further possibility for programmable resistance 266 is an array of MOSFET-based resistors. In yet a further embodiment, resistances 264 and 266 may be implemented using a switched capacitor circuit.

Some embodiments, the reference voltage for the voltage divider for may be provided, for example, by one or more reference voltages Vrefp_1 to Vrefp_n. These reference voltages may be either internally generated or externally generated. For example, in some embodiments reference voltages Vrefp_1 to Vrefp_n may be generated by external power supplies used to supply power to external sensors. Output voltages generated by the sensors may be referenced with respect to its respective power supply. In some embodiments, more than one reference applied may be selected using signal IMODE. In such cases, the selected reference voltage corresponds with the input voltage selected by input switching array 204 is shown in FIG. 2a. For example, if input Vin_1 is selected by input switching array 204, the corresponding reference voltage Vrefp_1 is selected within reference DAC 260.

Figure 2C:
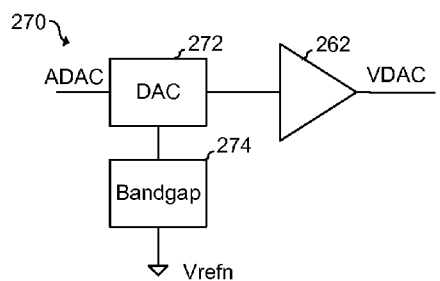

FIG. 2c illustrates reference DAC 270 that may also be used to implement reference DAC 246 illustrated in FIG. 2a. Here, DAC 272 is referenced to an internally generated reference voltage Vref_int that is generated using a bandgap voltage reference 274. In alternative embodiments, other voltage reference circuits may be used in place of bandgap reference 274. DAC 272 may be implemented, for example, using a programmable voltage divider as described above with respect to FIG. 2b, or by using other DAC architectures known in the art. For example, in one embodiment DAC 272 may be implemented using, for example, a current DAC loaded by a resistor, an R2R ladder, or other architecture. The output of DAC 272 may be buffered using voltage buffer 262. Alternatively, voltage buffer 262 may be eliminated if the output impedance of 272 is sufficiently low to drive the bottom plates of capacitor array 240 that is illustrated in FIG. 2a within the requisite time constant determined by the sampling rate.

Vref_int may be used to provide a constant reference to DAC 272 while differences in reference voltages among various voltage inputs are accounted for by adjusting control input ADAC. For example, during operation, when input voltage Vin_1 is selected by input switching array 204, control signal ADAC is selected by gain calibration controller 244 to produce a reference voltage VDAC that produces a full-scale value that corresponds to reference voltage Vrefp_1. On the other hand, when input voltage Vin_2 is selected by input switching array 204, control signal ADAC is selected by gain calibration controller 244 to produce a reference voltage VDAC that produces a full-scale value that corresponds to reference voltage Vrefp_2.

Figure 2D:
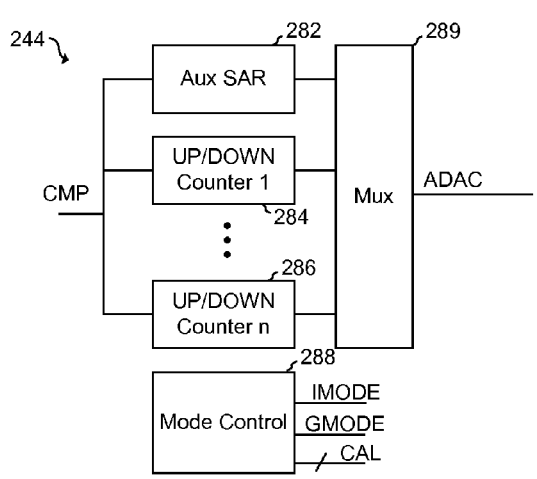

FIG. 2d illustrates a detailed view of embodiment gain calibration controller 244. Reference DAC control signal ADAC may be generated using one of a number of blocks. For example, auxiliary successive approximation register 282 may be used to perform a binary search an output value of VDAC that corresponds to a full-scale output voltage. Up/down counter 284 may be further used to perform a linear search for an output value of VDAC that corresponds to a full-scale output voltage. In some embodiments, multiple up down counters and/or auxiliary successive approximation register's may be used to derive and store a plurality of reference DAC control signals ADAC depending on the particular input voltage being used. For example, one block may be used to derive and store a value of ADAC that causes the data converter to output a full-scale code for an analog input value that corresponds to a first full-scale reference voltage. Another block may be used to derive and store of value of ADAC that causes the data converter to output a full-scale code for an analog input value that corresponds to a second full-scale reference voltage. Embodiments of the present invention may contain any number of successive approximation and/or up/down counter blocks. The output of these blocks may be multiplexed to control output ADAC using multiplexer 289. In the illustrated embodiment of FIG. 2d, only three of such blocks are shown for simplicity of illustration. In alternative embodiments of the present invention, a single successive approximation block and/or a single up down counter block may be used. In such cases, the derived values for ADAC may be stored in a memory and then be recalled depending on which analog input value is selected by input switching array 204.

In an embodiment, auxiliary successive approximation register 282 may be used to quickly derive an initial value for output word ADAC during initialization and/or power up. In some embodiments, up down counter 284 or up down counter 286 may be used to periodically update the value of a DAC during operation. For example, after a certain number of samples, for example one-hundred samples or one-thousand samples a single calibration cycle as described above may be inserted. After each single calibration cycle, the value of up/down counter 284 or 286 is either incremented or decremented based on the output of comparator 234 shown in FIG. 2a. Therefore, over time the value of VDAC may be caused to slowly track variations due to temperature drift and changes in the output voltages of the various input supplies.

Gain calibration controller 244 may also contain mode control block 288 that provides mode control signals IMODE and GMODE and DAC switching array calibration control word CAL. As discussed above, control word CAL may represent a full-scale word that is configured to cause DAC switching array 242 to couple the bottom plates of capacitor array 242 to either reference voltage the VDAC or to reference node Vrefn or ground.

Figure 2E:
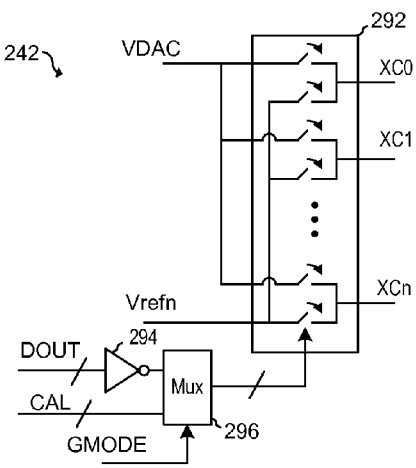

FIG. 2e illustrates a detailed view of DAC switching array 242. In an embodiment, switches 292 select between reference voltage VDAC and reference voltage Vrefn according to control word DOUT. Therefore, depending on the state of control word DOUT, signals XC0, XC1 to XCn may be coupled to either VDAC or Vrefn. Inverting buffer 294 is illustrated as being coupled between DOUT and switches 292 to illustrate the negative feedback relationship between node T and DOUT, in that an increase in node T over threshold Vref causes a resultant value of DOUT that causes a decrease in node T with respect to threshold Vref in the next cycle. In some embodiments, inverting buffer 294 may be present and the inverse relationship between node T and DOUT is maintained by nature of the particular implementation of switches 292. During normal operation of the data converter, DOUT is selected via mode signal GMODE and multiplexer 296. On the other hand, during gain calibration, calibration value CAL may be selected. As mentioned above, calibration value CAL may be hard-coded within DAC switching array 242. It should be appreciated that DAC switching array 242 shown in FIG. 2d is just one example of many possible implementations.

Figure 3:
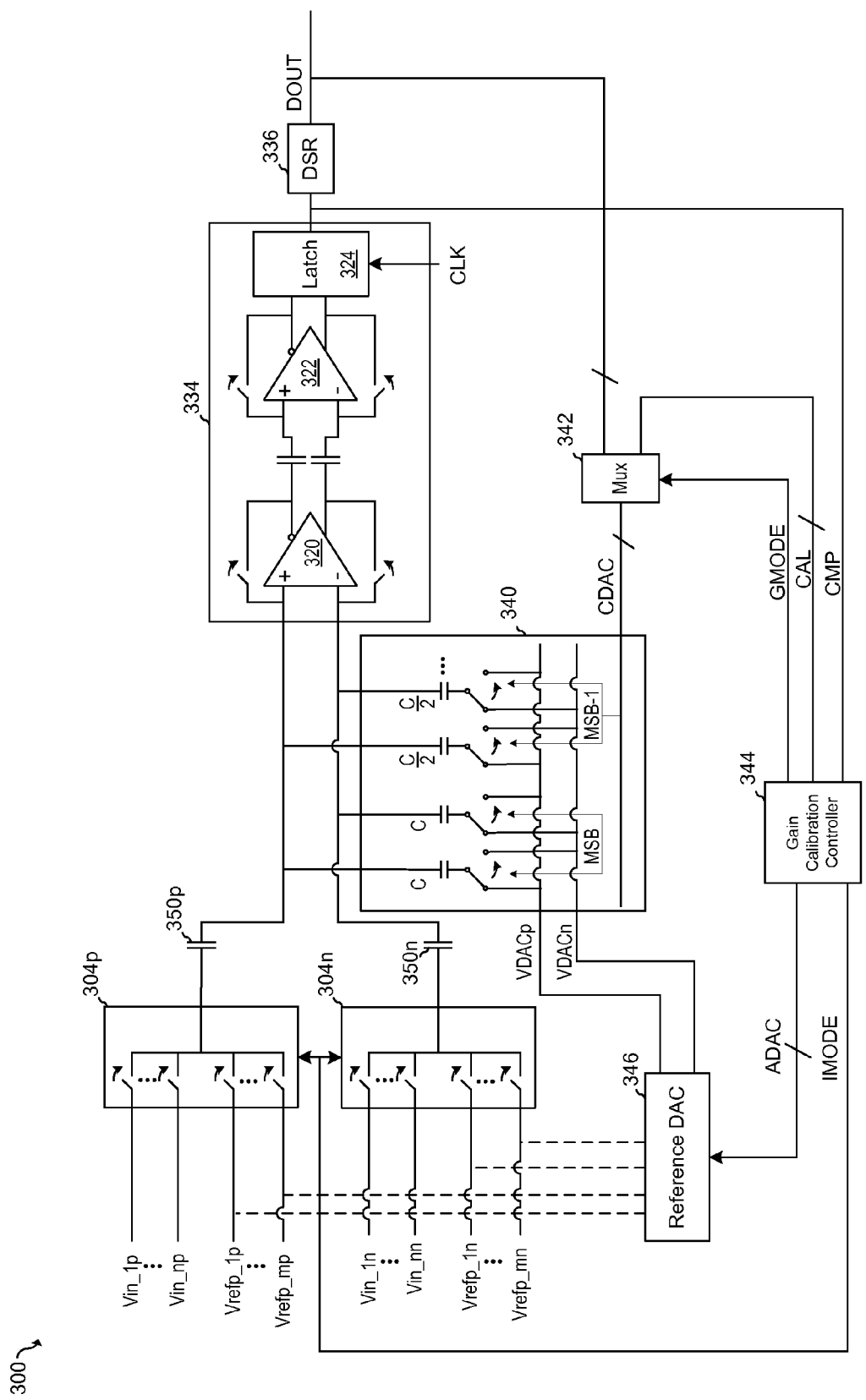
FIG. 3 illustrates a data acquisition circuit according to a differential embodiments.

FIG. 3 illustrates data converter 300 according to a further embodiment of the present invention. Data converter 300, which is arranged in a differential configuration, operates according to similar principles as data converter 200 illustrated in FIG. 2a. Input switching array 304p multiplexes positive voltage inputs Vin_1p to Vin_np, and voltage reference inputs Vrefp_1p to Vrefp_mp to the bottom plate of capacitor 350p. Similarly, input switching array 304n multiplexes positive voltage inputs Vin_1p to Vin_nn, and voltage reference inputs Vrefp__1n to Vrefp_nm to the bottom plate of capacitor 350n. Capacitors 350p and 350n may be implemented using a single capacitance, or multiple switchable capacitors in order to provide an added degree of gain selection and/or calibration. The top plates of capacitors 350p and 350n are further coupled to the top plates of switchable capacitor array 340 and to the input of differential comparator 334.

In an embodiment, differential comparator 334 may be implemented using two cascaded amplifier stages 320 and 322 followed by latch 324. It should be understood that comparator 334 may be implemented using other comparator architectures known in the art including. Differential comparator 334 may also be implemented using a multi-level comparator.

Digital search register 336 and gain calibration controller 344 may operate according to the same principles as digital search register 236 and gain calibration controller 244 described with respect to FIG. 2a hereinabove. During calibration, gain calibration controller 344 asserts signal GMODE to select a pre-defined switch configuration work on bus CAL via multiplexer 342, as described above with respect to FIG. 2e. Gain calibration controller also asserts signal IMODE in order to select a pair of reference voltages via input switching arrays 304p and 304n. Reference DAC 346 is configured to output differential voltage including signals VDACp and VDACn using DAC structures described above, as well as other conventional DAC structures. Switchable capacitor array 340 includes an array of capacitors having bottom plates switchably coupled to Reference DAC output voltages VDACp and VDACn. While switchable capacitor array 340 is shown as a binary weighted capacitor array having capacitances C and C/2, it should be understood that switchable capacitor array may have any number of capacitors that are binary weighted or non-binary weighted. In the example shown, the MSB bit of control word CDAC operates the switches coupled to the bottom plates of the capacitances C, and the MSB-1 bit of control word CDAC is operates the switches coupled to the bottom plates of capacitances C/2. It should be further understood that bus CDAC may have any number of bits controlling switches coupled to any number to the bottom plates of any number of capacitors within switchable capacitor array 340.

In an embodiment, the gain calibration controller 344 calibrates the gain of data converter 300 in a similar manner that gain calibration controller 244 calibrates the gain of data converter 200 shown in FIG. 2a above.

Figure 4:
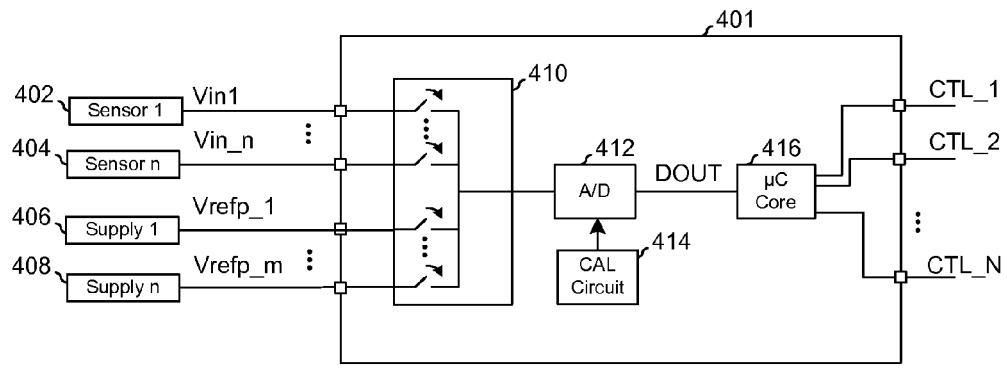
FIG. 4 illustrates a block diagram of an embodiment integrated circuit.

FIG. 4 illustrates an example application system using embodiment controller integrated circuit 401 that includes input switching array 410, A/D converter 412, calibration circuit 414 and microprocessor core 416. Input switching array 410, A/D converter 412 and calibration circuit 414 operate according to the embodiment principles described above. As shown, any number of sensors 1 to n (402 to 404), and any number of supplies 1 to m (406 to 408) may be coupled to input switching array 410 within integrated circuit 401. The output of A/D converter 412 is coupled to microprocessor core 416 that produces control outputs CTL__1, CTL__2 to CTL_P, where P represents the number of control outputs available on integrated circuit, 401. In some embodiments, for example automotive control applications, these control outputs may be used to control various automotive functions, such as airbag circuits, antilock brake equipment, engine control, and the like. In other embodiments, these control outputs may be used, for example, to power lights are displays. Alternatively, control outputs CTL__1 to CTL_P may be used to control other functions depending on the particular application and its specifications. In some embodiments, an integrated circuit 401 is a general purpose controller circuit that may be used in a variety of different applications.

Figure 5:
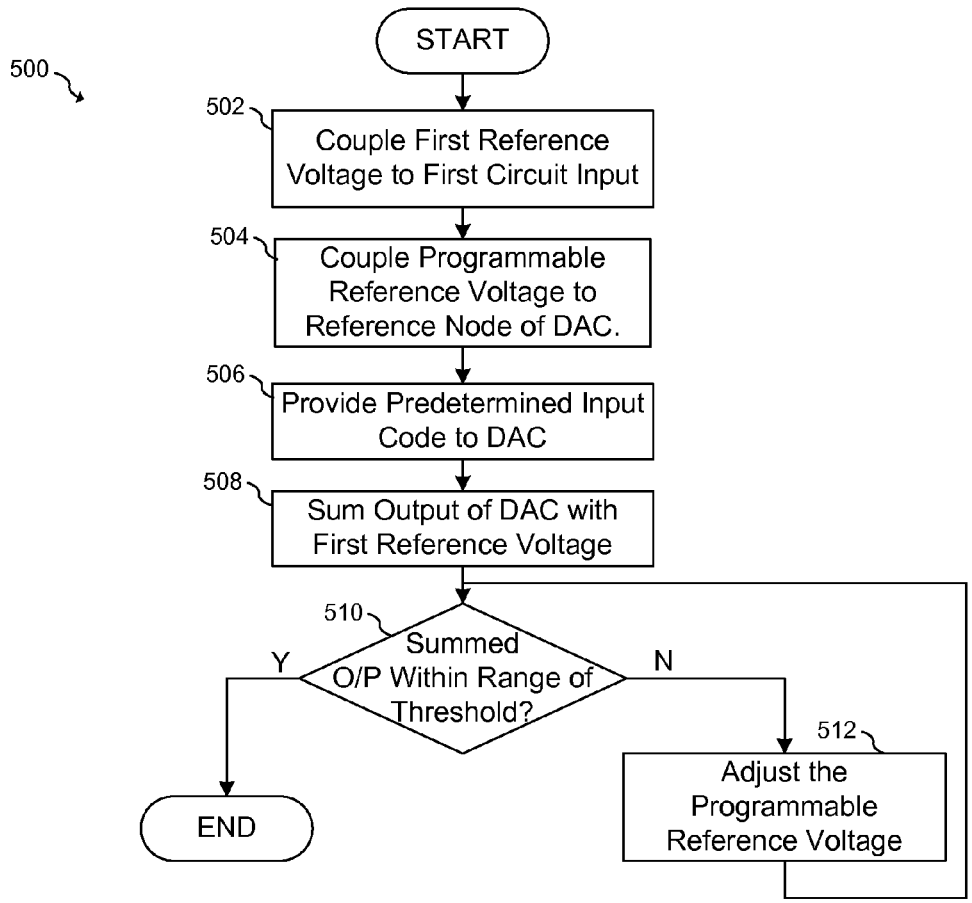
FIG. 5 illustrates a flowchart of an embodiment method.

FIG. 5 illustrates flow chart 500 of an embodiment calibration method. In step 502, a first reference voltage is coupled to a first circuit input. This first circuit input may be an input of an A/D converter, and the coupling may be implemented using a switch to couple the analog output of the sensor to the bottom plates of a sampling capacitor, as described with respect to the embodiment shown in FIG. 2a. Next, in step 504, the programmable reference voltage is coupled to a reference node of a DAC. This may be performed, for example, by coupling voltage VDAC to DAC switching array 242 shown in FIG. 2a. Next, a predetermined input code is provided to a DAC in step 506. In one example, step 506 is implemented by having DAC switching array 242 output a full-scale output code. Next, in step 508, the output of the DAC is summed with the first reference voltage. This may be implemented, for example, by performing a charge redistribution step between capacitor array 240 and input sampling 250 as described above. In alternative embodiments of the present invention, this step may be implemented by subtracting the output of a DAC from the first reference voltage. In step 510, the method determines whether or not the summed output of the DAC with the first reference voltage is within a predetermined range of a first threshold. If the summed output of the DAC is within the predetermined range of the first reference voltage, the calibration process ends. Otherwise, the programmable reference voltage is adjusted in step 512 and another comparison is made in step 510. It should be appreciated that in alternative embodiments of the present invention other similar methods may be used depending on the application and its particular specifications.

In accordance with an embodiment, a method of calibrating a circuit includes coupling a first reference voltage to a first input of the circuit, coupling a programmable reference voltage to a reference node of a digital-to-analog converter (DAC), such that the gain of the DAC is dependent on an input value at the reference node. The method further includes providing a first predetermined input code to the DAC, summing an output of the DAC with the first reference voltage to produce a summed output, comparing the summed output to a threshold, and adjusting the programmable reference voltage until the summed output is within a predetermined range of the threshold. In some embodiments, the predetermined input code may be a full-scale code.

In an embodiment, summing the output of the DAC with the first reference voltage includes sampling the first reference voltage on a first node of a first capacitor, and coupling a plurality of first nodes of a capacitor array to the reference node, such that the capacitor array is coupled to the first capacitor. Next, a charge balancing operation of the first capacitor and the capacitor array is performed. Comparing the summed output of the DAC to the threshold may include comparing a node common to the first capacitor and the capacitor array to the threshold. The node common to the first capacitor and the capacitor array includes top plates of the first capacitor and the capacitor array.

Adjusting the programmable reference voltage may include performing a binary search that includes adjusting the programmable reference voltage at a first granularity based on the comparing, and then adjusting the programmable reference voltage at a second granularity, such that the first granularity is courser than the second granularity. In some embodiments, adjusting the programmable reference voltage includes performing a binary search when the circuit is initialized, and performing a linear search after the circuit is initialized.

In an embodiment, performing the linear search includes incrementing the programmable reference voltage when the summed output is at a first side of the threshold, and decrementing the programmable reference voltage when the summed output is at a second side of the threshold opposite the first side of the threshold. Incrementing may include incrementing an up/down counter, and decrementing may include decrementing an up/down counter.

In an embodiment, the circuit includes an analog-to-digital converter (ADC), and adjusting the programmable reference voltage includes adjusting the programmable reference voltage in between a plurality of ADC conversion steps.

In an embodiment, the method further includes coupling a second reference voltage to the first input of the circuit, summing an output of the DAC with the second reference voltage to produce a second summed output, comparing the second summed output to the threshold, and adjusting the programmable reference voltage until the second summed output is within a predetermined range of the threshold. Coupling the first reference voltage may include coupling a supply voltage of a first sensor, and coupling the second reference voltage comprises coupling a supply voltage of a second sensor.

In accordance with a further embodiment, an analog-to-digital converter (ADC) includes an input capacitor having a first terminal coupled to an input node and a second terminal coupled to a common node, and an input switching device having an output terminal coupled to the input node, a first input terminal configured to be coupled to a measurement input, and a second input terminal configured to be coupled to a reference input. The ADC also includes a charge redistribution digital-to-analog converter (DAC) comprising a capacitor array having a plurality of first terminals coupled to a switching array and second terminals coupled to the common node, a comparator having an input coupled to the common node, a digital search register having an coupled to an output of the comparator and an output coupled to the switching array, a programmable voltage source coupled to the switching array; and a control circuit having an input coupled to the output of the comparator and an output coupled to a control input of the programmable voltage source.

In some embodiments, the control circuit is configured to couple the second input terminal to the input node, and adjust the programmable voltage source until a full-scale output of the charge redistribution DAC substantially corresponds to a threshold of the comparator. The control circuit includes an auxiliary successive approximation register having an input coupled to the output of the comparator and an output coupled to the control input of the programmable voltage source. In some embodiments, the control circuit comprises a first up/down counter having an input coupled to the output of the comparator and an output coupled to the control input of the programmable voltage source.

In an embodiment, the input switching device further includes a third input terminal configured to be coupled to a second reference input, and the control circuit further comprises a second up/down counter having an input coupled to the output of the comparator and an output coupled to the control input of the programmable voltage source. The second up/down counter may be configured to be active when the third input terminal is coupled to the input node via the input switching device. In an embodiment, the programmable voltage source includes a resistor divider having at least one adjustable resistor and/or a second DAC, which may be referenced to a bandgap voltage generator.

In an embodiment, the second DAC is referenced to a first supply domain and the input switching device is referenced to a second supply domain. The first supply domain has a lower supply voltage than a signal range of the second supply domain, the input switching devices comprises transistors rated at a first voltage, and the second DAC comprises transistors rated at a second voltage, wherein the first voltage is greater than the second voltage.

In some embodiments, the digital search register includes a successive approximation register, the input capacitor may include a plurality of switchably selectable capacitors, and/or the comparator may be implemented using a multi-bit comparator. In further embodiments, the input capacitor comprises a differential input capacitor, the input switching device comprises a differential input switching device, and the comparator comprises a differential comparator.

An advantage of embodiments includes the ability to perform accurate ratiometric analog-to-digital conversions over a number of inputs having different reference voltages. Another advantageous aspect of some embodiments includes the ability to integrate an A/D converter that is configured to accept a voltage input range higher than the power supply range of the A/D converter. Another advantageous aspect of embodiments of the present invention is the ability to calibrate an A/D converter to have an accurate full-scale range voltage that exceeds the power supply voltage of the internal circuits of the A/D converter Another advantageous aspect of some embodiments of the present invention is the ability to reference the gain of an A/D converter to have an accurate full-scale range that corresponds to a reference voltage greater than the internal power supply of the A/D converter. In some embodiments, this may be accomplished without using large switches that are rated at a high voltage. Rather, the output of a voltage reference is derived using the calibration procedure in some embodiments.

Further advantages include the ability to operate the data converter core of embodiment data converters at a low voltage, for example, 1.5V, thereby allowing for an extended power supply voltage range. Another advantageous aspect of embodiments that utilize a selectable input capacitor, is the ability to implement multiple separate and/or more flexible gain settings in embodiment data converters.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A method of calibrating a circuit, the method comprising:
   coupling a first reference voltage to a first input of the circuit;
   coupling a programmable reference voltage to a reference node of a digital-to-analog converter (DAC), wherein a gain of the DAC is dependent on an input value at the reference node;
   providing a first predetermined input code to the DAC;
   summing an output of the DAC with the first reference voltage to produce a summed output;
   comparing the summed output to a threshold; and
   adjusting the programmable reference voltage until the summed output is within a predetermined range of the threshold.

2. The method of claim 1, wherein the predetermined input code is a full-scale code.

3. The method of claim 1, wherein summing the output of the DAC with the first reference voltage comprises:
sampling the first reference voltage on a first node of a first capacitor;
coupling a plurality of first nodes of a capacitor array to the reference node, wherein the capacitor array is coupled to the first capacitor; and
performing a charge balancing operation of the first capacitor and the capacitor array.

4. The method of claim 3, wherein comparing the summed output of the DAC to the threshold comprises comparing a node common to the first capacitor and the capacitor array to the threshold.

5. The method of claim 4, wherein the node common to the first capacitor and the capacitor array comprises top plates of the first capacitor and the capacitor array.

6. The method of claim 1, wherein adjusting the programmable reference voltage comprises performing a binary search, wherein performing the binary search comprises:
adjusting the programmable reference voltage at a first granularity based on the comparing; and
after adjusting the programmable reference voltage at the first granularity, adjusting the programmable reference voltage at a second granularity, wherein the first granularity is courser than the second granularity.

7. The method of claim 1, wherein adjusting the programmable reference voltage comprises:
performing a binary search when the circuit is initialized; and
performing a linear search after the circuit is initialized.

8. The method of claim 7, wherein performing the linear search comprises:
incrementing the programmable reference voltage when the summed output is at a first side of the threshold; and
decrementing the programmable reference voltage when the summed output is at a second side of the threshold opposite the first side of the threshold.

9. The method of claim 8, wherein:
the incrementing comprising incrementing an up/down counter; and
the decrementing comprises decrementing an up/down counter.

10. The method of claim 1, wherein:
the circuit comprises an analog-to-digital converter (ADC); and
adjusting the programmable reference voltage includes adjusting the programmable reference voltage in between a plurality of ADC conversion steps.

11. The method of claim 1, further comprising:
coupling a second reference voltage to the first input of the circuit;
summing an output of the DAC with the second reference voltage to produce a second summed output;
comparing the second summed output to the threshold; and
adjusting the programmable reference voltage until the second summed output is within a predetermined range of the threshold.

12. The method of claim 11, wherein:
coupling the first reference voltage comprises coupling a supply voltage of a first sensor; and
coupling the second reference voltage comprises coupling a supply voltage of a second sensor.

13. A circuit comprising:
a digital-to-analog converter (DAC) comprising a reference input, wherein a gain of the DAC depends on an input value at the reference input;
a programmable reference signal generator having an output coupled to the reference input;
a summation circuit coupled to an output of the DAC and to a first input node;
a comparator having an input coupled to an output of the summation circuit; and
a control circuit configured to:
couple a first reference voltage to the first input node,
provide a first predetermined input code to a control input of the DAC, and
adjust an output programmable reference signal generator until the output of the summation circuit is within a first range of a threshold of the comparator.

14. The circuit of claim 13, wherein the programmable reference signal generator comprises a second DAC.

15. The circuit of claim 14, wherein the control circuit comprises an auxiliary successive approximation register configured to perform a binary search of DAC codes of the second DAC.

16. The circuit of claim 15, wherein the control circuit comprises:
an auxiliary successive approximation register configured to perform a binary search of DAC codes of the second DAC during initialization of the circuit; and
an up/down counter configured to perform a linear search of DAC codes of the second DAC periodically during operation of the circuit.

17. The circuit of claim 15, wherein the control circuit further comprises an up/down counter configured to perform a linear search of DAC codes of the second DAC.

18. The circuit of claim 13, wherein:
the first input node is configured to accept input voltages at a first input voltage range; and
the programmable reference signal generator comprises circuitry referenced to an internal supply voltage having a supply voltage of less than the first input voltage range.

19. The circuit of claim 13, further comprising a main successive approximation register having an input coupled to an output of the comparator and output bus coupled to the control input of the DAC.

20. The circuit of claim 13, wherein:
the DAC comprises a capacitor array having a plurality of capacitors having first plates coupled together at a common node and second plates switchably coupled to the reference input; and
the summation circuit comprises an input capacitor having a first plate coupled to the input node and a second plate coupled to the common node of the capacitor array.

21. The circuit of claim 13, wherein the comparator comprises an auto-zeroing comparator.

22. An analog-to-digital converter (ADC) comprising:
an input capacitor having a first terminal coupled to an input node and a second terminal coupled to a common node;
an input switching device having an output terminal coupled to the input node, a first input terminal configured to be coupled to a measurement input, and a second input terminal configured to be coupled to a reference input;
a charge redistribution digital-to-analog converter (DAC) comprising a capacitor array having a plurality of first terminals coupled to a switching array and second terminals coupled to the common node;
a comparator having an input coupled to the common node;
a digital search register having an input coupled to an output of the comparator and an output coupled to the switching array;

a programmable voltage source coupled to the switching array; and a control circuit having an input coupled to the output of the comparator and an output coupled to a control input of the programmable voltage source.

23. The ADC of claim 22, wherein the control circuit is configured to:
  couple the second input terminal to the input node; and
  adjust the programmable voltage source until a full scale output of the charge redistribution DAC substantially corresponds to a threshold of the comparator.

24. The ADC of claim 22, wherein the control circuit comprises an auxiliary successive approximation register having an input coupled to the output of the comparator and an output coupled to the control input of the programmable voltage source.

25. The ADC of claim 22, wherein the control circuit comprises a first up/down counter having an input coupled to the output of the comparator and an output coupled to the control input of the programmable voltage source.

26. The ADC of claim 25, wherein:
  the input switching device further comprises a third input terminal configured to be coupled to a second reference input; and
  the control circuit further comprises a second up/down counter having an input coupled to the output of the comparator and an output coupled to the control input of the programmable voltage source, wherein the second up/down counter is configured to be active when the third input terminal is coupled to the input node via the input switching device.

27. The ADC of claim 22, wherein the programmable voltage source comprises a resistor divider having at least one adjustable resistor.

28. The ADC of claim 22, wherein the programmable voltage source comprises a second DAC.

29. The ADC of claim 28, wherein the second DAC is referenced to a bandgap voltage generator.

30. The ADC of claim 28, wherein:
  the second DAC is referenced to a first supply domain and the input switching device is referenced to a second supply domain;
  the first supply domain has a lower supply voltage than a signal range of the second supply domain;
  the input switching devices comprises transistors rated at a first voltage; and
  the second DAC comprises transistors rated at a second voltage, wherein the first voltage is greater than the second voltage.

31. The ADC of claim 22, wherein the digital search register comprises a successive approximation register.

32. The ADC of claim 22, wherein the input capacitor comprises a plurality of switchably selectable capacitors.

33. The ADC of claim 22, wherein the comparator comprises a multi-bit comparator.

34. The ADC of claim 22, wherein:
  the input capacitor comprises a differential input capacitor;
  the input switching device comprises a differential input switching device; and
  the comparator comprises a differential comparator.

* * * * *